United States Patent [19]
Ritchie

[11] Patent Number: 5,818,307
[45] Date of Patent: Oct. 6, 1998

[54] DIRECTIONAL COUPLER HAVING INDUCTOR CROSSING MICROSTRIP TRANSMISSION LINE

[75] Inventor: Paul F. Ritchie, Sunrise, Fla.

[73] Assignee: Motorola, Inc., Schaumburg, Ill.

[21] Appl. No.: 815,502

[22] Filed: Mar. 11, 1997

[51] Int. Cl.[6] .............................. H03H 7/48; H01P 5/18
[52] U.S. Cl. ........................................ 333/112; 333/116
[58] Field of Search .................... 333/112, 116, 333/246

[56] References Cited

U.S. PATENT DOCUMENTS

| | | | |
|---|---|---|---|
| 3,440,571 | 4/1969 | Simons | 333/112 |
| 3,716,806 | 2/1973 | Zelenz | 333/112 |
| 3,904,991 | 9/1975 | Ishii et al. | 333/116 |
| 5,448,771 | 9/1995 | Klomsdorf et al. | 333/116 X |

*Primary Examiner*—Paul Gensler
*Attorney, Agent, or Firm*—Barbara R. Doutre

[57] ABSTRACT

A directional coupler (300) is formed of a substrate (302) having a microstrip transmission line (304) and an inductor (306) seated perpendicularly across the microstrip transmission line. The windings (312) of the inductor (306) run parallel to the microstrip transmission line (304). One end (308) of the inductor (306) is terminated with a load (314) to reduce reflections while the other end (310) is coupled to a diode (316) and a capacitor (322) resonant at the frequency of interest and providing an output port for the coupler. The radio frequency (RF) signal is inductively coupled from the microstrip transmission line (304) to the windings (312) of the coil and converted through the diode (316) and the capacitor (322) to a voltage output (Vout) at the output port (324).

6 Claims, 2 Drawing Sheets

DIRECTIONAL COUPLER HAVING INDUCTOR CROSSING MICROSTRIP TRANSMISSION LINE

TECHNICAL FIELD

This invention relates in general to directional couplers and more particularly to the design of such devices for radio frequency (RF) applications.

BACKGROUND

Directional couplers are used in a variety of applications including power detectors, signal sampling, and filters. Traditional directional couplers are built of discrete components and coupled traces on a circuit board substrate. FIG. 1 shows a prior art directional coupler 100 including a microstrip transmission line 102 proximately coupled to trace 104 on a printed circuit board substrate 106. A resistive load 108 is coupled to one end of the trace 104 and a Schottky diode, also referred to as a hot carrier diode, 110 is coupled to the other end of the trace 104. A capacitor 112 is coupled between the diode 110 and ground potential. Basically, the coupler takes a radio frequency (RF) signal from the microstrip transmission line and converts it to a voltage output (Vout) 114. FIG. 2 shows the schematic equivalent 200 of the coupler 100 described in FIG. 1. The coupler operates by inductively coupling the RF signal from the microstrip transmission line 102 onto the trace 104 where the load impedance is selected to minimize reflections and increase directivity and the capacitor is selected to be resonant at the frequency of interest such that a voltage output is provided at output port Vout 114.

However, the coupled line directional coupler described in FIG. 1 is impractical for lower frequency applications such as used in many mobile and portable radio products. Mobile radio products operating in the 30 megahertz (MHz) to 200 MHz range and portable radio products operating in the 30 MHz to 600 MHz range for example, are often faced with size and space constraints which necessitate the use of transformers instead of the directional coupler incurring higher costs to the products.

Accordingly, it would be a benefit to have a directional coupler which incorporates low frequency operation along with minimal size.

DETAILED DESCRIPTION OF THE PREFERRED EMBODIMENT

Figure 2:
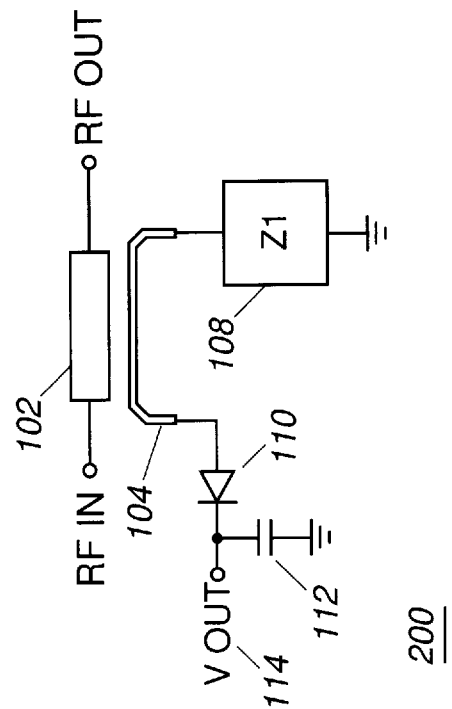
FIG. 2 is a schematic representation of the prior art coupler of FIG. 1.
Figure 1:
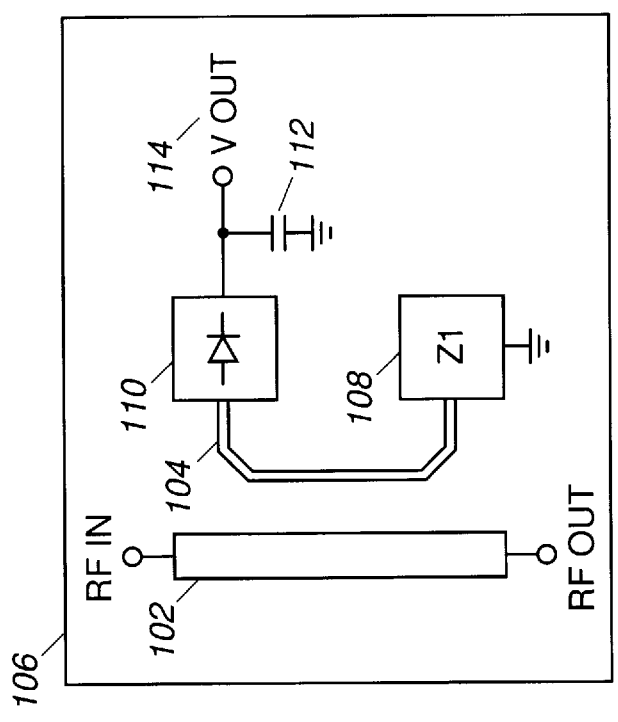
FIG. 1 is a prior art directional coupler.

While the specification concludes with claims defining the features of the invention that are regarded as novel, it is believed that the invention will be better understood from a consideration of the following description in conjunction with the drawing figures, in which like reference numerals are carried forward.

Figure 3:
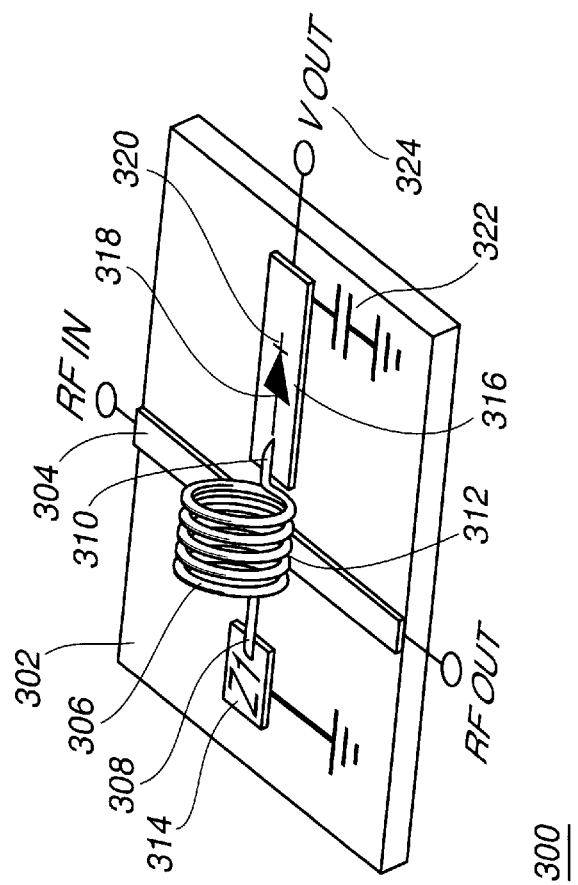
FIG. 3 is an isometric view of a directional coupler formed in accordance with the present invention.

Referring now to FIG. 3, there is shown a directional coupler 300 in accordance with the present invention. Directional coupler 300 is formed of a substrate 302, such as a printed circuit board, upon which a microstrip transmission line 304 is disposed. In accordance with the present invention, the coupler 300 includes an inductor 306 having first and second ends 308, 310 which are coupled to the substrate such that the inductor sits perpendicular to and crossing over the microstrip transmission line 304. In accordance with the present invention, inductor 306 comprises an air wound coil having a predetermined number of windings 312 disposed across the microstrip transmission line 304 such the coil's windings run substantially parallel to the microstrip transmission line. A load (Z1) 314 is coupled between the first end 308 of the inductor 306 and ground potential to reduce reflections. A Schottky diode 316 having an anode 318 and a cathode 320 is coupled to the second end 310 of the inductor 306 through the anode 318. A capacitor 322 is coupled between the diode's cathode 320 and ground potential. The capacitor 322 is selected to be resonant at the frequency of interest. The RF signal carried by the microstrip transmission line 304 is inductively coupled to the windings 312 of the coil and translated to an output voltage (Vout) at output port 324. A coil with enhanced dielectric properties is preferably selected as inductor 306 so as to provide insulation between the microstrip transmission line and the windings 312.

Figure 4:
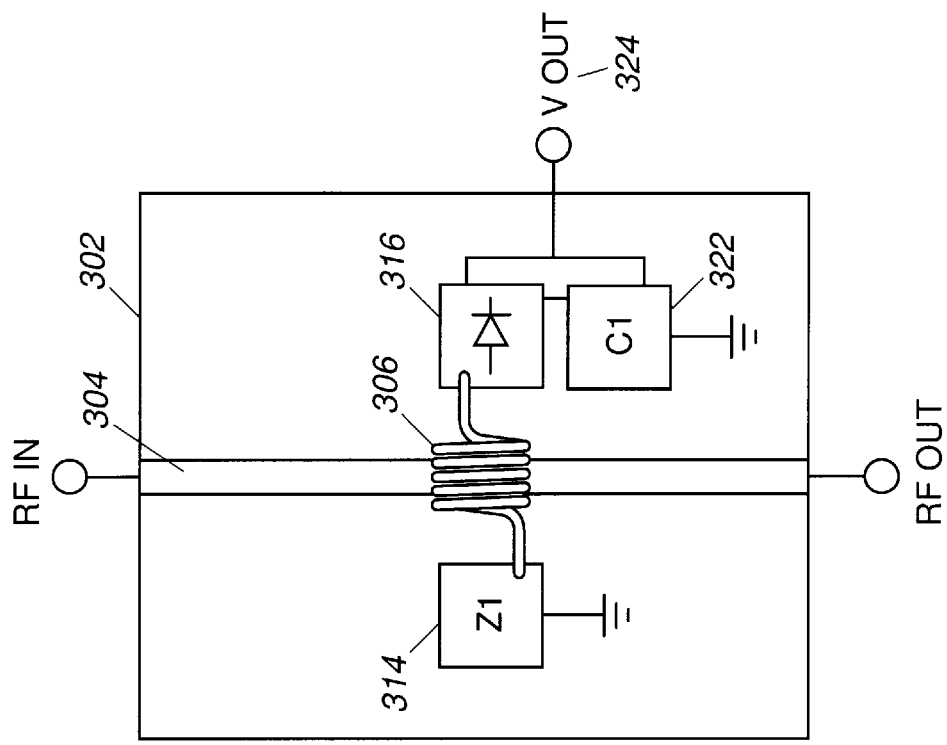
FIG. 4 is a top view of directional of the coupler of FIG. 3.

FIG. 4 shows a top view of the directional coupler of FIG. 3 in accordance with the present invention. By orienting the windings 312 of inductor 306 to run substantially parallel to the microstrip transmission line 304, the directivity of the coupling action between the inductor and the microstrip transmission line 304 is maximized. The greater the number of windings across the microstrip transmission line the greater the coupling. Coupling is also affected by the cross sectional area of the inductor. The impedance loading 314 is selected, preferably through simulations, modeling, and/or experimentation, to minimize reflections at the terminated end of the coupler 300 thereby increasing directivity.

The directional coupler 300 described by the invention is especially beneficial to lower frequency applications by providing the advantage of small size as compared to the prior art coupler. The directional coupler 300 described by the invention provides a low cost alternative to the use of a transformer in mobile and portable radio applications. Thus, reduced size, ease of manufacturing, and low cost are all benefits achieved with the directional coupler provided by the invention.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A directional coupler, comprising:
    a substrate;
    a microstrip transmission line carrying a radio frequency (RF) signal;
    a lumped parameter inductor having first and second ends, the inductor disposed on the substrate perpendicularly to and crossing over the microstrip transmission line, the RF signal coupling to the inductor from the microstrip transmission line;
    a load termination coupled to the first end of the inductor;
    a diode having an anode and a cathode, the anode being coupled to the second end of the inductor;
    a capacitor coupled to the cathode of the diode, the capacitor being resonant at the frequency of the RF signal; and an output port coupled to the capacitor.

2. A directional coupler as described in claim 1, wherein the diode comprises a Schottky diode.

3. A directional coupler as described in claim 1, wherein the inductor comprises an air wound coil.

4. A directional coupler as described in claim 3, wherein the air wound coil is formed of windings running substantially parallel to the microstrip transmission line.

5. A directional coupler, comprising:

a substrate;

a microstrip transmission line formed on the substrate, the microstrip transmission line for coupling an RF signal;

an air wound coil coupled to the substrate through first and second ends, the air wound coil crossing over the microstrip transmission line such that the air wound coil sits substantially perpendicular to the microstrip transmission line;

a load terminating the first end of the air wound coil;

a diode coupled to a second end of the air wound coil; and a capacitor coupled to the diode and resonant at the frequency of the RF signal, the RF signal being coupled through the air wound coil and converted to a voltage output through the diode and capacitor.

6. A directional coupler, comprising:

a substrate;

a microstrip transmission line disposed on the substrate and providing a radio frequency (RF) signal;

an air wound coil having windings formed between first and second ends, the first and second ends being coupled to the substrate, the air wound coil disposed across the microstrip transmission line such that a predetermined number of windings run substantially parallel to the microstrip transmission line;

a load coupled between the first end of the of the air wound coil and ground potential of the substrate;

a diode having an anode and a cathode, the anode being coupled to the second end of the air wound coil and the cathode providing an output port for the directional coupler; and a capacitor coupled between the output port and ground potential.

\* \* \* \* \*